United States Patent [19]
Lebby et al.

[11] Patent Number: 5,943,357
[45] Date of Patent: Aug. 24, 1999

[54] LONG WAVELENGTH VERTICAL CAVITY SURFACE EMITTING LASER WITH PHOTODETECTOR FOR AUTOMATIC POWER CONTROL AND METHOD OF FABRICATION

[75] Inventors: Michael S. Lebby, Apache Junction; Jamal Ramdani, Gilbert; Wenbin Jiang, Phoenix, all of Ariz.

[73] Assignee: Motorola, Inc., Schaumburg, Ill.

[21] Appl. No.: 08/912,605

[22] Filed: Aug. 18, 1997

[51] Int. Cl.⁶ .............................. H01S 3/19; H01S 3/08; H01L 21/20
[52] U.S. Cl. .................................. 372/50; 372/96; 438/24
[58] Field of Search ................................. 372/50, 92, 96; 257/82; 438/23, 24

[56] References Cited

U.S. PATENT DOCUMENTS

| | | | |
|---|---|---|---|
| 5,574,744 | 11/1996 | Gaw et al. | 372/96 |
| 5,577,064 | 11/1996 | Swirhun et al. | 372/50 |
| 5,606,572 | 2/1997 | Swirhun et al. | 372/96 |
| 5,732,101 | 3/1998 | Shin | 372/50 |
| 5,809,050 | 9/1998 | Baldwin et al. | 372/50 |

OTHER PUBLICATIONS

Hasnain et al, "Monolithic Integration of Photodetector with Vertical Cavity Surface Emitting Laser", Electronics Letters, vol. 27, No. 18, pp. 1630–1632, Aug. 1991.

Kim et al, "A Single Transverse Mode Operation of Top Surface Emitting Laser Diode with a Integrated Photodiode", LEOS '95, IEEE Lasers and Electro–Optics Society 1995 Annual Meetings, pp. 416–417, Oct. 1995.

*Primary Examiner*—Rodney Bovernick
*Assistant Examiner*—Quyen Phan Leung
*Attorney, Agent, or Firm*—Eugene A. Parsons; William E. Koch

[57] ABSTRACT

A long wavelength VCSEL with a photodetector, wherein the VCSEL includes a first and second stack of DBRs disposed on a first surface of a first substrate element, having an active region sandwiched therebetween, and a PIN photodetector including a first doped region disposed on a second substrate element, a undoped region disposed on the first doped region, and a second doped region disposed on the undoped region. The PIN photodetector is mounted to an opposed surface of the first substrate element, thereby monitoring a back VCSEL emission. The device is fabricated to allow for automatic power control (APC) of the VCSEL.

25 Claims, 1 Drawing Sheet

LONG WAVELENGTH VERTICAL CAVITY SURFACE EMITTING LASER WITH PHOTODETECTOR FOR AUTOMATIC POWER CONTROL AND METHOD OF FABRICATION

FIELD OF THE INVENTION

This invention relates, in general, to optical devices and, more particularly, to light emitting devices and photodetectors.

BACKGROUND OF THE INVENTION

Vertical cavity surface emitting lasers (VCSEL) typically include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by a current forced through the active region, typically achieved by providing a first contact on the reverse side of the substrate and a second contact on top of the second mirror stack.

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which is subsequently use to adjust the power input to the edge emitting device, thereby adjusting the power output.

However, automatic power control of a vertical cavity surface emitting laser (VCSEL) has typically been achieved through the use of optical devices, such as photodiodes or photodetectors, mirrors, beam splitters, and the like that are positioned manually in the optical path of the emission from the VCSEL. With the optical devices being positioned manually, several problems or disadvantages result, such as a high cost of manufacture, a lack of repeatability, and poor quality control.

Accordingly, it can be readily seen that conventional VCSELs and signal detection has several disadvantages and problems, thus not enabling their manufacture in a compact form. Therefore, a VCSEL device that includes a photodetector and method for making same that simplifies the fabrication process, reduces cost, and improves reliability would be highly desirable.

It is a purpose of the present invention to provide a new and improved VCSEL and photodetector device for automatic power control (APC) of the VCSEL emission.

It is another purpose of the present invention to provide a new and improved VCSEL and photodetector device which is simple and relatively inexpensive to manufacture.

It is still another purpose of the present invention to provide a new and improved VCSEL and photodetector device which is fabricated with a minimum of labor and cost.

It is a further purpose of the present invention to provide a new and improved VCSEL and photodetector device which can be utilized to control the output of the VCSEL.

SUMMARY OF THE INVENTION

The above problems and others are at least partially solved and the above purposes and others are realized in a device including a vertical cavity surface emitting laser and a PIN photodetector. The PIN photodetector being mounted on the opposed side of a substrate element on which the VCSEL is formed. The VCSEL device includes a first stack of distributed Bragg reflectors disposed on a surface of the substrate element, an active area disposed on the first stack of distributed Bragg reflectors, and a second stack of distributed Bragg reflectors disposed on the active area. The PIN photodetector includes a p-doped region, an undoped region or an intrinsic region, and an n-doped region. The device is fabricated to electrically isolate a vertical cavity surface emitting laser, more particularly, an optical pathway through which light is generated and passes, and a photodetector for automatic power control (APC) of the VCSEL.

BRIEF DESCRIPTION OF THE DRAWING

The novel features believed characteristic of the invention are set forth in the claims. The invention itself, however, as well as other features and advantages thereof will be best understood by reference to the detailed description which follows, when read in conjunction with the accompanying drawing, wherein:

DESCRIPTION OF THE PREFERRED EMBODIMENTS

Figure 1:
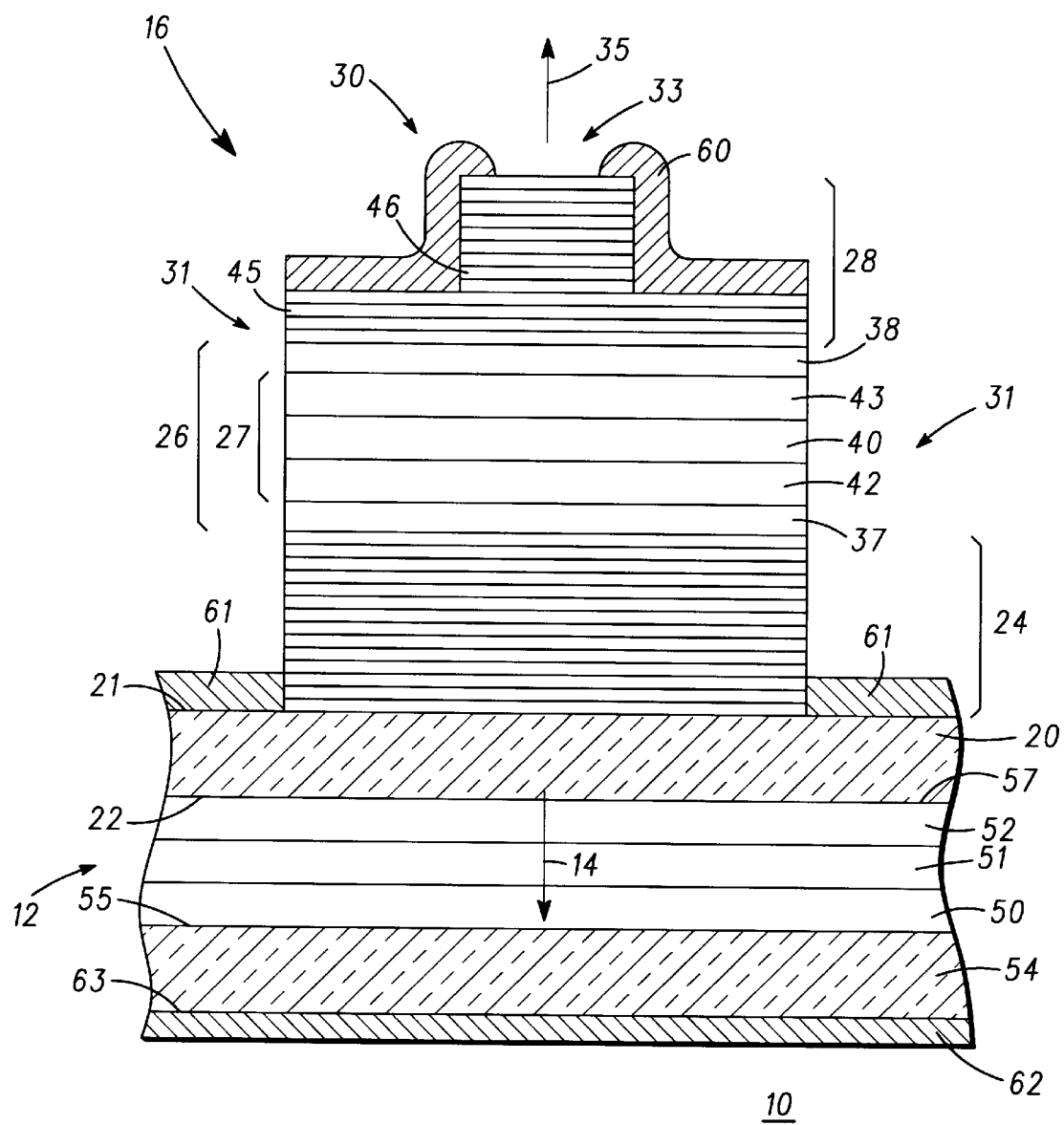
FIG. 1 is a simplified sectional view of a VCSEL with a PIN photodetector in accordance with the present invention.

FIG. 1 illustrates a device 10 that includes a PIN photodetector 12 for measuring light, more particularly a back emission, represented by an arrow 14, generated by a VCSEL 16. It should be noted that in FIG. 1, VCSEL 16 is represented by a ridge VCSEL.

In this particular invention, device 10 is fabricated by disposing a plurality of layers on a surface 21 of a substrate element 20 to form VCSEL 16. PIN photodetector 12 is bonded or fused on an opposed surface 22 of substrate element 20. VCSEL 16 and PIN photodetector 12 are subsequently electrically isolated to complete device 10.

In this particular embodiment, PIN photodetector 12 is bonded or fused directly to opposed surface 22 of substrate element 20. PIN photodetector 12 includes a p-doped region, an undoped region or an intrinsic region, and a n-doped region (discussed presently). VCSEL 16 includes the deposition of a first stack 24 of distributed Bragg reflectors (DBR), an active region 26, and a second stack 28 of distributed Bragg reflectors. As illustrated in FIG. 1, ridge VCSEL 16 is shown to include a ridge 30 defined by sidewalls 31 and a surface 33, utilized to define a light and current path, more particularly an optical pathway for the light, illustrated by arrow 35, generated by VCSEL 16, and to contain the current flowing through VCSEL 16.

It should be understood that FIG. 1 is a simplified illustration and that many elements have been purposefully omitted or simplified to more clearly illustrate the present invention. Further, it should be noted that FIG. 1 is a sectional view, thereby illustrating that the device 10 extends into and out of the figure as well as to either side. It will be understood that device 10 represents a single device or an array of devices.

Generally, as shown in FIG. 1, device 10, more particularly VCSEL 16, and photodetector 12, are each made by any well-known method or process in the art, thereafter being bonded or fused one to the other. However, for the purposes of orienting the reader, a description of materials and methods composing VCSEL 16 and photodetector 12 is provided hereinbelow.

Typically, VCSELs are formed by depositing a plurality of layers on a substrate to form the VCSEL. See, for example, U.S. Pat. No. 5,034,092, entitled "PLASMA ETCHING OF SEMICONDUCTOR SUBSTRATES", issued Jul. 23, 1991, assigned to the same assignee and included herein by this reference, and U.S. Pat. No. 5,256,596, entitled "TOP EMITTING VCSEL WITH IMPLANT", issued Oct. 26, 1993, assigned to the same assignee and included herein by this reference. VCSEL 16 of the present invention is formed on a substrate 20, which in this specific embodiment, is n-doped GaAs, more specifically either GaAs (100) or GaAs (111). GaAs is used to facilitate epitaxial growth of the components of VCSEL 16 which emits light in long wavelengths approximately in the range of 1.3 μm–1.6 μm. It should be understood that light of this wavelength is able to pass through substrate 20, thereby capable of being monitoring by detector 12 (discussed presently). While it should be understood that either GaAs (100) or GaAs (111) can be used for substrate 20, when GaAs (111) is employed, the surface crystal orientation will allow for longer wavelength continuous wave (CW) operation at normal operating temperatures. More specifically, the use of a GaAs material having a (111) oriented substrate will allow for the extension of an emitted wavelength up to 1.1 μm when only InGaAs is used in the active region. This wavelength extension is extremely hard to achieve on a (100) substrate surface crystal orientation.

Substrate 20 has an upper surface 21 on which a mirror stack 24 is disposed. Mirror stack 24 includes a plurality of mirror pairs in a GaAs/AlGaAs material system. An active region 26 is disposed on mirror stack 24. Active region 26, includes an active structure 27 sandwiched between a first cladding region 37 adjacent first mirror stack 24 and a second cladding region 38. A second mirror stack 28 is disposed on second cladding region 38 and includes mirror pairs in a GaAs/AlGaAs material system.

Mirror stack 24 is grown by epitaxially depositing pairs of layers on substrate 20. In order to crystal lattice match mirror stack 24 to substrate 20 a suitable semiconductor material system must be deposited. In this specific example, substrate 20 is GaAs and, therefore, a GaAs/AlGaAs material system is employed. Approximately 20–40 mirror pairs of this material system are deposited on substrate 20 depending on the difference between the refractive indices of the layers. The different refractive index the layers of each pair is achieved by altering the aluminum content. In this specific embodiment, a GaAl.7As layer 17 and a GaAs layer 18 forming a mirror pair is preferred. The large number of pairs increases the percentage of reflected light.

Cladding region 37 includes one or more layers which may be graded if necessary for more efficient carrier and optical confinement in active structure 27. In this specific embodiment, cladding region 37 is formed of an InGaP or GaAsP material system. This combination of materials allows for increased carrier and optical confinement in VCSEL 16.

Active structure 27, in this embodiment, includes one nitride based quantum well layer 40 sandwiched between barrier layers 42 and 43. For example quantum well layer 40 and barrier layers 42 and 43 are each approximately 100Å thick and the total thickness of active region 26 is approximately one wavelength of the emitted light or a multiple thereof. Quantum well layer 40 is formed of $Ga_{1-y}In_yAs_{1-x}(N)_x$, more specifically $Ga_{0.75}In_{0.25}As_{1-x}N_x$, where x=0.0001–0.1, and barrier layers 42 and 43 are formed of GaAsP or GaAs for strain compensation. More specifically, the GaInAsN quantum well are under compression, and the GaAsP barrier layers are under tension. Therefore, due to this strain compensation, the indium composition in the quantum well layer 40 can be increased in a range of 5–10%. This increase in the indium material allows for a longer wavelength emission without the generation of misfit dislocations utilizing the same thickness of active region 26 (100Å). In addition, it should be understood that dependent upon the crystal orientation of the GaAs substrate 20, a higher indium composition can be utilized. One skilled in the art will understand that more quantum well layers and barrier layers can be used to compose active structure 27 depending upon the application. Active region 26 and first and second mirror stacks 24 and 28 respectively are configured to emit light with a wavelength in a range of approximately 1.3–1.6 micrometers. To achieve this range quantum well layer 40 is configured with a direct energy band-gap in a range of approximately 0.775 eV to 0.954 eV. The mole fraction of the indium is higher than that found in a typical VCSEL structure due to the use of the GaAsP barrier layers 42 and 43. In that the incorporation of a nitride based quantum well active region is difficult at low growth temperatures, the use of a GaAs (111) substrate would further facilitate the achievement of a longer wavelength emission by adding a small fraction of nitrogen to the InGaAs. This fraction is much lower than the one required for a GaAs (100) substrate.

Cladding region 38 includes one or more layers which may be graded if necessary for more efficient carrier and optical confinement in active structure 27. In this specific embodiment, cladding region 38 is formed of an InGaP or AlGaAs material system.

Mirror stack 28 is grown by epitaxially depositing pairs of layers on cladding region 38. In order to crystal lattice match mirror stack 28 and active region 26, a suitable semiconductor material system must be deposited. In this specific example a GaAs/AlGaAs material system is employed. Approximately 20–40 mirror pairs of this material system are deposited on cladding region 38 depending on the difference between the refractive indices of the layers. The different refractive index the layers of each pair is achieved by altering the aluminum content. In this specific embodiment, a $GaAl_{0.7}As$ layer 45 and a GaAs layer 46 forming a mirror pair is preferred. The large number of pairs increases the percentage of reflected light. Further information regarding the fabrication of a long wavelength VCSEL disclosed herein can be found in U.S. pending application, Ser. No. 08/903,670, bearing attorney docket number CR 97-106, entitled "LONG WAVELENGTH VERTICAL CAVITY SURFACE EMITTING LASER", mailed on Jul. 31, 1997, assigned to the same assignee, and incorporated herein by this reference, and U.S. pending application, Ser. No. 08/904,189, bearing attorney docket number CR 97-107, entitled "LONG WAVELENGTH VERTICAL CAVITY SURFACE EMITTING LASER", mailed on Jul. 31, 1997, assigned to the same assignee and incorporated herein by this reference.

Next, a PIN photodetector is fabricated as illustrated in FIG. 1. defined by a plurality of layers, or regions, disposed on a substrate 54, which in this particular embodiment is an indium phosphide (InP) substrate. The plurality of regions typically are made to correspond to a p-doped region 50, an undoped or an intrinsic region 51, and an n-doped region 52, respectively, thereby forming PIN photodetector, or photodiode, 12. PIN photodetector 12 captures and measures the backward emission from VCSEL 16, thereby allowing the power output, i.e., light output of VCSEL 16, to be measured and subsequently adjusted to a desired level.

In a preferred embodiment of the present invention, regions 50, 51 and 52 are formed by depositing on a surface 55 of substrate 54, which in this particular embodiment is indium phosphide (InP), a first layer of indium phosphide (InP), or alternatively indium gallium arsenide (InGaAs), which is p-type doped, a second layer of indium gallium arsenide (InGaAs) which is undoped, and a third layer of indium phosphide (InP) which is n-type doped, thereby providing the necessary layers, or regions, for fabricating PIN photodiode 12. It should be understood that any suitable p-type doping or n-type doping, such as beryllium and silicon, respectively, can be used in doping of the first and third regions. It should also be noted that doping levels for PIN photodiodes are well known and need not be discussed here. Additionally, it should be understood that region 50 with the p-type dopant and region 52 having the n-type dopant can be reversed.

Generally, the thickness of region 51 should be as thin as possible to reduce the carrier transport time, thereby allowing photodetector 12 to be fast, but thick enough to absorb most of the backward emission. However, it should be understood that the thickness of region 51 is dependent on a wavelength of the generated light and the specific application for device 10.

The photons absorbed in the undoped InGaAs region create electron-hole pairs. Due to either the built-in field or the external field, if the PIN photo detector is reverse biased, the electrons will drift toward the n-contact region and the holes will drift toward the p-contact region. If there is a closed electrical loop between the n-contact and the p-contact, current flow can be detected. Depending on the magnitude of the current flow, which is proportional to the incident laser intensity, a feedback loop can be established to control the VCSEL injection current for VCSEL auto power control (APC).

Once PIN photodetector 12 is fabricated, an uppermost surface 57 of region 52 is bonded or wafer fused to surface 22 of substrate 20. More particularly, the interface of VCSEL 16 and photodetector 12 is fused or conductively bonded using a transparent adhesive material. It should be understood that once photodetector 12 is attached to VCSEL 16, using either fusing or bonding techniques, that substrate element 54 of photodetector 12 can be removed.

To complete device 10, a contact layer 60 is positioned on mirror stack 28, a contact layer 61 is positioned on surface 21 of substrate 20, or on stack 24 of distributed Bragg reflectors, and a contact layer 62 is positioned on an opposed surface 63 of substrate 54 of photodetector 12, for example on the rear surface thereof. In this particular embodiment, contact layers 60, 61 and 62 are formed of a gold based metal alloy. As will be understood by those skilled in the art, contact layer 60 is so constructed as to permit the emission of light from VCSEL 16.

In this particular embodiment, contact layer 60 serves as a p-contact for VCSEL 16, contact layer 61 serves as a shared n-contact for VCSEL 16 and photodetector 12, and contact layer 62 serves as a p-contact for photodetector 12. By providing contact layer 62 on substrate 54, substrate 54 becomes a part of an electrical path for PIN photodetector 12. Additionally, it should be understood that contact layer 60 is electrically coupled to contact layer 61 through stacks 24 and 28 of distributed Bragg reflectors, cladding regions 37 and 38, and active structure 27. Contact layer 62 is electrically coupled to contact layer 61 through substrate 54, regions 50, 51, and 52 and substrate element 20. This use of a plurality of contacts allow for the injecting of carriers into VCSEL 16, and the making of a complete electrical circuit which allows light 35 to be generated and subsequently emitted from VCSEL 16, while simultaneously allowing for automatic power control (APC) by photodetector 12.

Formation of contact layers 60, 61 and 62 is typically one of the last remaining steps in the formation of device 10, however, it is described herein so as to more clearly describe the present invention. Contact layers 60, 61 and 62 are made by any well-known method or combination of methods in the art, such as deposition (e.g., evaporation, sputtering or the like), heating (e.g., annealing), polishing (e.g., chemical mechanical polishing), or the like. Briefly and by way of example only, to fabricate contact layer 62, a conductive metal is deposited onto surface 63 of substrate 54. After the deposition, a heating step or an anneal step is performed to substrate 54, thereby annealing the conductive metal to substrate 54 and electrically coupling PIN photodetector 12 and substrate element 20 to contact layer 62 through substrate 54.

However, it should be noted that other alternatives or methods are also available for electrically interfacing PIN photodetector 12 and VCSEL 16. As previously stated, substrate 54 of PIN photodetector 12 can be selectively removed, thereby exposing a surface of region 50. Contact layer 62 can then be formed on the exposed surface of region 50 generally in the same manner as previously discussed with reference to forming contact 62 on substrate 54. In addition, it should be understood that contact layer 61 can be formed on an etched down surface (not shown) of first stack 24 of distributed Bragg reflectors.

During operation, VCSEL 16 is forward biased and PIN photodetector 12 is reverse biased or without bias, if the speed of PIN photodetector 12 is not of concern, thereby permitting photodetector 12 to monitor the backward emission of VCSEL 16. It should be understood that photodetector 12 monitors the backward emission that is proportional to the forward emission. In addition, it should be understood that the doping of the substrate elements and remaining layers which make up VCSEL 16 and PIN photodetector 12 can be reversed. More particularly, it should be understood that the structure symmetry exists for both the p and n dopants as well as electrically inverted structure designs.

By now it should be appreciated that a novel VCSEL with PIN photodetector and method for fabrication have been disclosed. The VCSEL and PIN photodetector are attached one to the other at an interface using either fusion techniques or conductively bonded utilizing a transparent adhesive material. This incorporation of the two devices into a single device enables the light output of the VCSEL to be easily monitored and subsequently adjusted to a desired level. Additionally, since the VCSEL and PIN photodetector are fabricated as one device, the integrated device is highly manufacturable, thus reducing cost and allowing significant improvements in reliability and quality.

While we have shown and described specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser with photodetector comprising:

a vertical cavity surface emitting laser formed on a surface of a first substrate element and generating a forward emission along a path in a direction away from the surface of the first substrate element on which the vertical cavity surface emitting laser is formed; and a PIN photodetector formed on a surface of a second substrate element, the PIN photodetector mounted on an opposed surface of the first substrate element, thereby aligned with the vertical cavity surface emitting laser, the PIN photodetector characterized as receiving a backward emission emitted by the vertical cavity surface emitting laser for automatic power control (APC) of the vertical cavity surface emitting laser.

2. A vertical cavity surface emitting laser with photodetector as claimed in claim 1 wherein the vertical cavity surface emitting laser further includes a first stack of distributed Bragg reflectors disposed on the surface of the first substrate element, an active region disposed on the first stack of distributed Bragg reflectors, and a second stack of distributed Bragg reflectors disposed on the active region, the first and second stacks of distributed Bragg reflectors and the active region fabricated so as to define a vertical cavity surface emitting laser characterized by an optical pathway through which light is generated and passes.

3. A vertical cavity surface emitting laser with photodetector as claimed in claim 2 wherein the active region, and the first and second stacks of distributed Bragg reflectors are configured to emit light with a wavelength in a range of approximately 1.3–1.6 micrometers.

4. A vertical cavity surface emitting laser and photodetector as claimed in claim 3 wherein the PIN photodetector further includes a first doped region disposed on the second substrate element, an undoped region disposed on the first doped region and a second doped region disposed on the undoped region.

5. A vertical cavity surface emitting laser and photodetector as claimed in claim 4 wherein the photodetector and vertical cavity surface emitting laser include electrical contacts, thereby electrically interfacing the photodetector and the vertical cavity surface emitting laser.

6. A vertical cavity surface emitting laser and photodetector as claimed in claim 5 wherein the photodetector is mounted to the first substrate element of the vertical cavity surface emitting laser using wafer fusion techniques.

7. A vertical cavity surface emitting laser and photodetector as claimed in claim 5 wherein the photodetector is mounted to the first substrate element of the vertical cavity surface emitting laser using electrically conductive transparent adhesive.

8. A vertical cavity surface emitting laser with photodetector comprising:
a first stack of distributed Bragg reflectors disposed on a first surface of a first substrate element, an active region disposed on the first stack of distributed Bragg reflectors, and a second stack of distributed Bragg reflectors disposed on the active region, the first and second stacks of distributed Bragg reflectors and the active region fabricated so as to define a vertical cavity surface emitting laser characterized as generating a forward emission along a path in a direction away from the first surface of the first substrate element on which it is formed and defining an optical pathway through which the forward emission light is generated and passes;

a first doped region disposed on a second substrate element, an undoped region disposed on the first doped region and a second doped region disposed on the undoped region defining a PIN photodetector, an uppermost surface of the second doped region mounted to a second surface of the first substrate element and in alignment with the vertical cavity surface emitting laser, the PIN photodetector characterized as receiving a backward emission emitted by the vertical cavity surface emitting laser for automatic power control (APC) of the vertical cavity surface emitting laser; and a plurality of electrical contacts coupled to the vertical cavity surface emitting laser and the PIN photodetector for supplying operating power thereto.

9. A vertical cavity surface emitting laser with photodetector as claimed in claim 8 wherein the active region, and the first and second stacks of distributed Bragg reflectors are configured to emit light with a wavelength in a range of approximately 1.3–1.6 micrometers.

10. A vertical cavity surface emitting laser with photodetector as claimed in claim 9 wherein the first substrate element is formed of an n-doped gallium arsenide (GaAs).

11. A vertical cavity surface emitting laser with photodetector as claimed in claim 10 wherein the second substrate element is formed of indium phosphide (InP).

12. A vertical cavity surface emitting laser with photodetector as claimed in claim 11 wherein the active region includes a quantum well layer sandwiched between a plurality of barrier layers.

13. A vertical cavity surface emitting laser with photodetector as claimed in claim 12 wherein the quantum well layer includes a gallium indium arsenide nitride (GaInAsN) material system and the plurality of barrier layers include one of a gallium arsenide phosphide (GaAsP) material system and a gallium arsenide (GaAs) material system.

14. A vertical cavity surface emitting laser with photodetector as claimed in claim 13 wherein the first doped region of the PIN photodetector is made of one of p-doped indium phosphide (InP) and p-doped indium gallium arsenide (InGaAs).

15. A vertical cavity surface emitting laser with photodetector as claimed in claim 13 wherein the undoped region of the PIN photodetector is, made of undoped indium gallium arsenide (InGaAs).

16. A vertical cavity surface emitting laser with photodetector as claimed in claim 13 wherein the second doped region of the PIN photodetector is made of n-doped indium phosphide (InP).

17. A method of fabricating a vertical cavity surface emitting laser with photodetector comprising the steps of forming a device to include a vertical cavity surface emitting laser formed on a surface of a first substrate element and a PIN photodetector mounted on an opposed surface of the first substrate element, the vertical cavity surface emitting laser fabricated to emit a forward emission in a direction away from the surface of the first substrate element on which it is formed and the PIN photodetector fabricated to receive a backward emission emitted by the vertical cavity surface emitting laser.

18. A method of fabricating a vertical cavity surface emitting laser with integrated PIN photodetectors as claimed in claim 17 wherein the step of forming a device to include a vertical cavity surface emitting laser and photodetector includes the steps of forming a first stack of distributed Bragg reflectors on the surface of the first substrate element, forming an active area on the first stack of distributed Bragg reflectors, and forming a second stack of distributed Bragg reflectors on the active area, thereby defining an optical pathway for the vertical cavity surface emitting laser.

19. A method of fabricating a vertical cavity surface emitting laser with photodetector as claimed in claim 18 wherein the step of forming a device to include a vertical cavity surface emitting laser and photodetector includes the steps of forming a PIN photodetector to include a first doped region disposed on a surface of a second substrate element, an undoped region disposed on the first doped region, and a second doped region disposed on a surface of the undoped region.

20. A method of fabricating a vertical cavity surface emitting laser with photodetector as claimed in claim 19 wherein the step of forming a device to include a vertical cavity surface emitting laser and photodetector includes the steps of mounting the photodetector to an opposed surface of the first substrate element utilizing one of wafer fusion techniques and an electrically conductive transparent adhesive.

21. A method of fabricating a vertical cavity surface emitting laser with photodetector as claimed in claim 20 wherein the step of forming a device to include a vertical cavity surface emitting laser and photodetector includes the steps of forming the vertical cavity surface emitting laser to emit light having a wavelength in a range of 1.3–1.6 micrometers.

22. A method of fabricating a vertical cavity surface emitting laser with photodetector as claimed in claim 21 wherein the step of forming a vertical cavity surface emitting laser includes forming a quantum well layer including gallium indium arsenide nitride (InGaAsN) and a plurality of barrier layers.

23. A method of fabricating a vertical cavity surface emitting laser with photodetector as claimed in claim 20 wherein the step of forming a PIN photodetector to include a first doped region, includes forming the first doped region of one of a p-doped indium phosphide (InP) and a p-doped indium gallium arsenide (InGaAs).

24. A method of fabricating a vertical cavity surface emitting laser with photodetector as claimed in claim 23 wherein the step of forming a PIN photodetector to include an undoped region, includes forming the undoped region of an undoped indium gallium arsenide (InGaAs).

25. A method of fabricating a vertical cavity surface emitting laser with photodetector as claimed in claim 24 wherein the step of forming a PIN photodetector to include a second doped region, includes forming the second doped region of a n-doped indium phosphide (InP).

* * * * *